US005695860A

United States Patent [19]
Imaichi et al.

[11] Patent Number: 5,695,860
[45] Date of Patent: *Dec. 9, 1997

[54] RESONANT TAG AND METHOD OF MANUFACTURING THE SAME

[75] Inventors: Hideaki Imaichi; Takeshi Matsumoto; Yuji Suzuki; Koichi Himura; Tadayoshi Haneda, all of Chigasaki, Japan

[73] Assignee: Tokai Electronics Co., Ltd., Kanagawa-Ken, Japan

[*] Notice: The term of this patent shall not extend beyond the expiration date of Pat. No. 5,447,779.

[21] Appl. No.: 522,956

[22] Filed: Sep. 1, 1995

Related U.S. Application Data

[63] Continuation-in-part of Ser. No. 9,855, Jan. 27, 1993, Pat. No. 5,447,779.

[30] Foreign Application Priority Data

Aug. 6, 1990 [JP] Japan ................................. 2-206791
Sep. 27, 1990 [JP] Japan ................................. 2-255210

[51] Int. Cl.$^6$ ........................................................ B32B 3/00
[52] U.S. Cl. .................... 428/209; 428/461; 428/515; 428/901; 156/634.1; 156/656.1; 156/661.11; 216/6; 216/13; 216/47; 216/52; 340/572
[58] Field of Search .......................... 428/209, 461, 428/515, 901; 216/6, 47, 13, 52; 156/631.1, 634.1, 645.1, 656.1, 659.11, 661.11, 902; 340/572

[56] References Cited

U.S. PATENT DOCUMENTS

| | | |
|---|---|---|
| 1,621,058 | 3/1927 | Burger . |
| 2,849,298 | 8/1958 | Werberig . |
| 3,211,973 | 10/1965 | Ferrante . |
| 3,227,934 | 1/1966 | Schill . |
| 3,231,479 | 1/1966 | Gordon et al. . |

(List continued on next page.)

FOREIGN PATENT DOCUMENTS

| | | |
|---|---|---|
| 980 445 | 12/1975 | Canada . |
| 0 142 380 | 11/1984 | European Pat. Off. . |
| 0 292 827 | 5/1988 | European Pat. Off. . |
| 0 380 426 | 1/1990 | European Pat. Off. . |
| 470 318 | 2/1992 | European Pat. Off. . |
| 509 289 | 10/1992 | European Pat. Off. . |
| 25 07 918 | 9/1976 | Germany . |
| WO 82/00541 | 2/1982 | WIPO . |
| WO 83/01697 | 5/1983 | WIPO . |
| 9209978 | 6/1992 | WIPO . |

OTHER PUBLICATIONS

A.R. Blythe, "Electrical Properties of Polymers" pp. 144-145 (1979).
W.G. Lawson, "Effects of Temperature and Techniques of Measurement on the Intrinsic Electric Strength of Polythene," 113 Proc. IEE 197 (1966).
The Radio Amateur's Handbook, 53rd Edition, 1976.
McMahon, et al., "Evaluation of Polyolefin High-Voltage Insulating Compounds; Dendrite (Tree) Formation Under Highly Divergent Fields," IEEE Transactions On, vol. 83, No. 12, Dec., 1964, pp. 1253–1261.

(List continued on next page.)

*Primary Examiner*—Elizabeth Evans
*Attorney, Agent, or Firm*—Finnegan, Henderson, Farabow, Garrett & Dunner, L.L.P.

[57] ABSTRACT

A resonant tag has one electrode plate of a capacitor and an electric circuit, which is electrically connected to the capacitor, formed on one surface of the insulating film composing the resonant circuit. On the other surface of the insulating film, the other electrode plate of the capacitor, which is electrically connected to the electric circuit, is formed. Heat pressing is performed on the insulating film existing between the two electrode plates with a predetermined pressure and at a predetermined temperature to shorten a distance between these electrode plates, and a crystal structure of the insulating film is destroyed to form a penetrating hole which penetrates through both the electrode plates.

9 Claims, 14 Drawing Sheets

U.S. PATENT DOCUMENTS

| | | |
|---|---|---|
| 3,241,014 | 3/1966 | Rubinstein . |
| 3,257,592 | 6/1966 | Maissel . |
| 3,260,904 | 7/1966 | Booe . |
| 3,316,467 | 4/1967 | Sperry . |
| 3,473,096 | 10/1969 | Johnson et al. . |
| 3,476,979 | 11/1969 | Stumpe et al. . |
| 3,500,373 | 3/1970 | Minasy . |
| 3,513,368 | 5/1970 | Boyer et al. . |
| 3,521,280 | 7/1970 | Janco et al. . |
| 3,562,496 | 2/1971 | Fisher . |
| 3,609,741 | 9/1971 | Miller . |
| 3,619,725 | 11/1971 | Sodem et al. . |
| 3,624,631 | 11/1971 | Chomet et al. . |
| 3,631,442 | 12/1971 | Fearon . |
| 3,676,742 | 7/1972 | Russel et al. . |
| 3,676,754 | 7/1972 | Maserjian et al. . |
| 3,678,437 | 7/1972 | Vaden . |
| 3,711,848 | 1/1973 | Martens . |
| 3,740,742 | 6/1973 | Thompson et al. . |
| 3,774,205 | 11/1973 | Smith et al. . |
| 3,780,368 | 12/1973 | Northeved et al. . |
| 3,787,717 | 1/1974 | Fischer et al. . |
| 3,810,147 | 5/1974 | Lichtblau . |
| 3,859,652 | 1/1975 | Hall et al. . |
| 3,863,244 | 1/1975 | Lichtblau . |
| 3,887,848 | 6/1975 | Larson et al. . |
| 3,913,219 | 10/1975 | Lichtblau . |
| 3,938,044 | 2/1976 | Lichtblau . |
| 3,967,161 | 6/1976 | Lichtblau . |
| 4,063,229 | 12/1977 | Welsch et al. . |
| 4,072,976 | 2/1978 | Harari . |
| 4,112,474 | 9/1978 | Wilson et al. . |
| 4,134,146 | 1/1979 | Stetson . |
| 4,150,419 | 4/1979 | Epple et al. . |
| 4,318,090 | 3/1982 | Narlow et al. . |
| 4,369,557 | 1/1983 | Vandebult . |
| 4,410,831 | 10/1983 | Shigemori et al. . |
| 4,498,076 | 2/1985 | Lichtblau . |
| 4,567,473 | 1/1986 | Lichtblau . |
| 4,583,099 | 4/1986 | Reilly et al. . |
| 4,689,636 | 8/1987 | Tait et al. . |
| 4,752,680 | 6/1988 | Larson . |
| 4,876,555 | 10/1989 | Jorgensen . |
| 5,108,822 | 4/1992 | Imaichi . |
| 5,119,070 | 6/1992 | Matsumoto . |
| 5,142,270 | 8/1992 | Appalucci . |
| 5,182,544 | 1/1993 | Aguilera . |
| 5,187,466 | 2/1993 | Pichl . |
| 5,201,988 | 4/1993 | Matsumoto . |
| 5,241,299 | 8/1993 | Appalucci . |
| 5,291,180 | 3/1994 | Reeb . |
| 5,447,779 | 9/1995 | Imaichi et al. ............... 428/209 |

OTHER PUBLICATIONS

Kitchin et al., "Treeing in Polyethylene as a Preclude to Breakdown," Transactions of the American Institute of Electrical Engineers, vol. 77, 1958, pp. 180–186.

Pratt, "A New Form of Needle Test for Polyethylene Insulation," IEEE Transactions, vol. PAS–87, No. 7, Jul. 1968, pp. 1609–1613.

5,695,860

1

RESONANT TAG AND METHOD OF MANUFACTURING THE SAME

CROSS-REFERENCE TO RELATED APPLICATION

The present application is a continuation-in-part of U.S. application Ser. No. 08/009,855, filed Jan. 27, 1993 now U.S. Pat. No. 5,447,779 issued Sep. 5, 1995, the complete disclosure of which is incorporated by reference.

BACKGROUND OF THE INVENTION

1. Field of the Invention

The present invention relates to resonant tags and a method of manufacturing such resonant tags. More particularly, the present invention relates to a resonant tag which is capable of resonating with a wave having a predetermined frequency generated by an electronic detector and of generating a wave having the same frequency as that at which it resonates, and which is adhered on products for the purpose of preventing robbery, such as shoplifting, and to a method of manufacturing such a resonant tag.

2. Description of the Related Art

Resonant tags have been adhered or otherwise secured on products for the purpose of preventing robbery such as shoplifting at various stores including supermarkets, specialty stores, department stores, and CD and video shops. Such resonant tags have a structure containing a resonant circuit which resonates with a wave having a frequency generated by an electronic detector located at an entrance/exit of a shop, and which generates a wave having the same frequency as that at which it resonates. The resonant tag is designed to lose its resonance frequency property after purchasing procedures, such as payment for the product, have been completed for a product on which the resonant tag is adhered, so that the electronic detector no longer detects resonance of the resonant tag. The resonant frequency property is eliminated usually by applying a predetermined voltage in a manner so that an insulating film of a capacitor included in the resonant circuit is damaged, thereby causing a dielectric breakdown. On the other hand, if before completion of the above-mentioned purchasing procedures, a product passes through an entrance/exit where the electronic detector is located, the resonant tag resonates with a wave generated by the electronic detector, and the electronic detector detects such resonance to produce an alarm sound indicating that a robbery has taken place.

The resonant circuit contained in the resonant tag is formed generally in the manner described below. Metal foils having different thicknesses are formed on both sides of a thin film (thickness: approximately 10–30 μm) made of an insulating material (for example, a synthetic resin film). Subsequently, one electrode plate of a capacitor and an electric circuit, including a coil, to be electrically connected to the electrode plate, are formed by using a thicker metal foil, while the other electrode plate of the capacitor is formed by using a thinner metal foil. The latter electrode plate is also electrically connected to the electric circuit. A resistance, inductance, capacitance (RLC) resonant circuit is formed by the above-described process.

Since variations in thickness of the insulating film of the capacitor greatly influence a resonance frequency of the RLC resonant circuit, it is required that the insulating film is formed to be of uniform thickness. It is also necessary to form the insulating film of the capacitor in the RLC resonant circuit to have a film thickness as thin as possible so that a dielectric breakdown can be caused at the lowest possible voltage.

2

However, since the insulating film is formed by an extrusion molding method, a problem arises out of a tendency for the insulating film to be produced with various thicknesses, depending on the precision of an extruder used and the quality of the manufacturing technique. Accordingly, at the present time, a portion of the capacitor, which corresponds to the insulating film, is pressed by using a jig die to establish a thinner portion. Making a portion of the insulating film of the capacitor thin by pressing in this manner brings about an advantage that a dielectric breakdown can easily occur at such a thin portion.

Even if the insulating film of the resonant tag has been subjected to a dielectric breakdown in the manner described above, there is a problem that the insulating film may recover to the state before the dielectric breakdown occurred and may resonate again with a wave generated by an electronic detector if heat or shocks, etc. are applied to the resonant tag, or after the passage of a long period of time after the dielectric breakdown. Accordingly, even if a product has been paid for and a dielectric breakdown has been caused on the insulating film of the capacitor of the resonant tag to eliminate the resonance frequency property of the resonant tag, there is a problem that when the product on which the resonant tag is adhered is brought into another shop, the resonant tag may resonate with a wave generated by an electronic detector located at that shop and the electronic detector may produce an alarm sound to falsely indicate that a robbery has taken place.

Furthermore, the impedance of the insulating film with the dielectric breakdown is not sufficiently low, and thus the complete elimination of its resonance frequency property could not be performed in the prior art.

SUMMARY OF THE PRESENT INVENTION

The present invention has been made in view of the above circumstances and has as an object to provide a resonant tag on which a breakdown of the resonance property can be performed with certainty, and further, which is designed to avoid repeated resonance with a wave generated by a detector once the resonant tag has lost its resonance frequency property by preventing the resonant tag from recovering to the state of the tag before of the breakdown occurred, and to provide a method of manufacturing such a resonant tag.

Another object of the present invention is to provide a resonant tag on which a complete breakdown of the resonance property can be performed by forming a short-circuit path between the two electrode plates.

Another object of the present invention is to provide an apparatus for manufacturing such a resonant tag.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the resonant tag manufacturing method of this invention comprises forming one electrode plate of the capacitor and an electric circuit, which is electrically connected to the capacitor, on one surface of an insulating film; forming the other electrode plate of the capacitor, which is electrically connected to the electric circuit, at the position opposite the one electrode plate on the other surface of the insulating film; and performing heat pressing by applying a predetermined pressure to the insulating film existing between the two electrode plates at a predetermined temperature to shorten a distance between these electrode plates, and then to destroy a crystal structure of the insulating film to form a penetrating hole which opens through to both the electrode plates.

The inventors of this invention discovered that normally, by performing heat pressing on the insulating film used as the insulating film of a capacitor, a lattice defect portion of the insulating film, which has a low degree of crystallinity, expands and the crystal structure of such portion breaks, causing this portion to suffer heat contraction resulting in a crevasse, and that such crevasse grows into a hole-shaped space which penetrates through to both the electrode plates of the capacitor and in which a gaseous substance or air exists. As a result, it was discovered that the process of performing heat pressing on the insulating film until a penetrating hole (hole-shaped space) extending from one electrode plate to the other electrode plate of the capacitor is formed.

According to this invention, a breakdown of the resonance property takes place with certainty. Since an arc discharge occurs at the penetrating hole, and thus a metallic port of the electrode plates extends through the penetrating hole, the two electrode plates are short-circuited even by application of a comparatively low voltage. After the short-circuit of the electrode plates of the insulating film takes place, a sturdy, short-circuit path, which cannot be easily destroyed by an outside stimulation, is formed along the penetrating hole. This makes it possible to prevent the portion of the insulating film which has been subjected to the short-circuit from recovering to the state before the short-circuit even if heat or shocks are applied to the insulating film of the capacitor of the resonant tag, or even if a long period of time has passed after the original occurrence of the short-circuit. Furthermore, since the insulating film with the penetrating hole formed obtains stability, such insulating film can be stored in the state before occurrence of the short-circuit for a long period of time without any hindrance. Accordingly, for example, even if a seller of a product attaches the resonant tag on the product and then stores it for a long period of time, or, if any outside stimulation is applied to the product during transportation, it is possible to avoid any hindrance to the performance of the resonant tag. Therefore, the reliability of the resonant tag is also enhanced.

An appropriate combination of pressure and temperature for the heat press is selected according to a film thickness and type of the insulating film so that the penetrating hole can be formed in the insulating film. However, if the pressure is too high, there is a tendency to cause hindrance to the function of the insulating film of the capacitor. On the other hand, if the pressure is too low, the penetrating hole cannot be formed. Therefore, it is necessary to select an optimal pressure by taking the above fact into consideration. Similarly, if the temperature of heat pressing is too high, the conductive metal, which makes up the electrode plates of the capacitor, and the insulating film are damaged. If the temperature is too low, the penetrating hole cannot be formed. Therefore, it is necessary to select an optimal temperature by taking the above factors into consideration.

Moreover, it is possible to prevent, with even more certainty, recovery of the resonance property by performing heat pressing on either one of the electrode plates until a break is formed, and through which the insulating film is exposed. This is because this break releases heat, shocks, and vibrational energy which tend to cut the short-circuit path, and simultaneously releases any stress or distortion which the insulating film itself generates when it receives the above-mentioned outside stimulation. Further, by forming a protrusion circumferentially around the pressed portion of the insulating film having a thin film thickness, the stress or distortion that the insulating film itself generates is also imposed on the top of the protrusion, thereby inhibiting the stress or distortion from being transmitted to the thin film portion. Therefore, it is possible to avoid the recovery of the resonance property with more certainty.

According to the method of manufacturing the resonant tag of this invention, the heat pressing may be performed by forming one electrode plate in a thinner film than that of the other electrode plate, by supporting the latter electrode plate with a supporter, and by pressing the one electrode plate with heat by using a jig die. By performing the heat pressing from the side of the electrode plate which has a thinner film thickness, it is possible to conduct heat effectively to the insulating film and to form the penetrating hole securely and easily. Moreover, when forming the other electrode plate to have a thick film thickness, for example, if the other electrode plate and the electric circuit are formed simultaneously from the same conductive metal foil, it is possible to make the film thickness of the electric circuit also thick. Accordingly, electric resistance of the electric circuit can be low.

In performing the heat pressing operation, it is possible to form the penetrating hole in the insulating film more effectively and with more certainty by using a supporter which has a two-layer structure including of a layer of an elastic, heat-resistant material and a metal layer, and by supporting the other, relatively thick electrode plate with the side of the above-mentioned metal layer.

It is also possible to form the penetrating hole in the insulating film more effectively and with certainty by using a jig die which comprises a heating means and the end of which contacting with the other electrode plate is tapered around its periphery toward its central axis, and by performing the heat pressing by making the tapered end face of the jig die to contact with the other electrode plate. Since the jig die is tapered as described above, the jig die can be easily separated from the electrode plate after the heat press.

Moreover, the present invention provides a resonant tag in which a resonant circuit including a capacitor is formed. One electrode plate of the capacitor and an electric circuit, which is electrically connected to the capacitor, are formed on one surface of an insulating film, while the other electrode plate of the capacitor, which is electrically connected to the electric circuit, is formed on the other surface of the insulating film. The insulating film existing between the two electrode plates has a portion with a thinner film thickness than that of its remaining portion, and a crystal structure of the thin film portion is destroyed to form a penetrating hole which extends through to both the electrode plates.

As described above, this resonant tag is capable of preventing the portion of the electrode plates of the capacitor which has been subjected to a short circuit from recovering to the state before the short circuit occurred. The resonant tag also suffers no hindrance on the insulating film even if it is stored for a long period of time in the state before being subjected to the short circuit. Since the portion of the electrode plates of the capacitor subject to the short circuit is previously made in a thin film thickness, and also since an arc discharge occurs at the penetrating hole, it is possible to perform the breakdown on the resonance property with certainty even with application of a low voltage.

The resonant tag of this invention may be constructed to have a protrusion formed circumferentially around the pressed portion of the insulating film in a thin film thickness.

The resonant tag of this invention may also be constructed to have a break formed in either one of the electrode plates of the capacitor, through which break the insulating film is exposed. By forming the resonant tag in the above-described construction, it is possible to prevent the recovery of the resonance property with more certainty.

Furthermore, the present invention provides an apparatus for performing heat pressing on an insulating film, comprising a supporter for supporting one side of the insulating film; and a jig die for pressing the other side of the insulating film with heat. The supporter comprises a two-layer structure consisting of a layer of elastic, heat-resistant material and a metal layer. The jig die comprises a heating means and one end of the jig die, which contacts with the other electrode plate, is tapered around its periphery toward its central axis. By using this apparatus, heat pressing can be performed easily and securely on the insulating film at a predetermined temperature and with a predetermined pressure.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

DETAILED DESCRIPTION OF THE PREFERRED EMBODIMENTS

Figure 1:
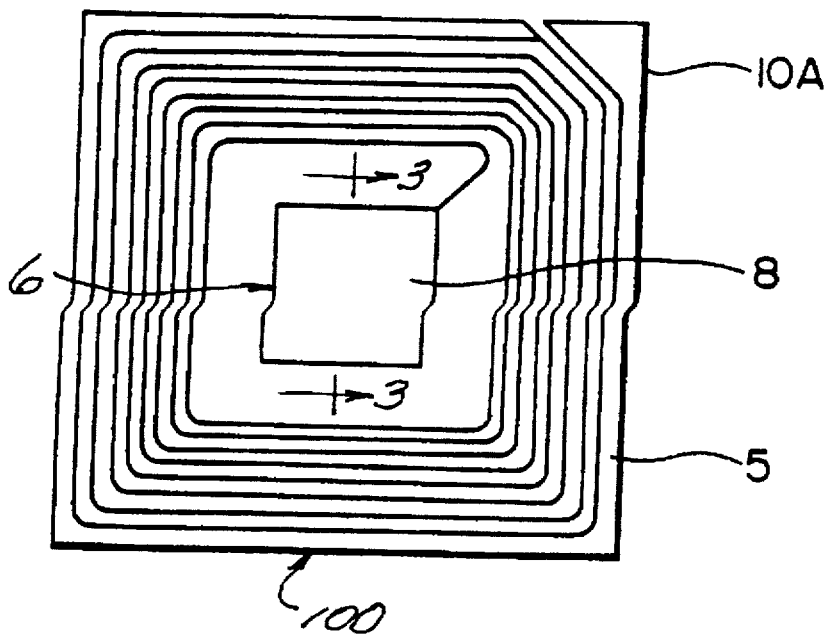
FIG. 1 is a plan view of the resonant circuit of one embodiment of the present invention.

Embodiments of the present invention are hereinafter explained with reference to the drawings.

As shown in FIGS. 1 through 4, a resonant tag 100 of the present invention includes electrode plates 8 and 9 which are respectively formed on opposite sides of an insulating film 1 and which, with the insulating film 1, form a capacitor 6; and a coil 5 which is formed on the surface of the insulating film 1 on which the electrode plate 8 is formed, and which is electrically connected to the electrode plates 8 and 9. This resonant tag 100 constitutes an RLC resonant circuit having to a predetermined resonance frequency formed by the capacitor 6 and the coil 5.

The electrode plate 8 is composed of a conductive metal of a greater foil thickness than that of the electrode plate 9, and is positioned approximately at the middle of the resonant tag. As described later in more detail, these electrode plates 8 and 9 are flat and formed in a generally quadrilateral shape corresponding to the shape of the jig die to be used in the manufacturing process. The size of the electrode plate 9 is slightly larger than that of the electrode plate 8.

The coil 5 is made of a conductive metal foil which has the same thickness as that of the electrode plate 8. As shown in FIG. 1, the coil 5 is mounted along the outside periphery of the electrode plate 8 and has a spiral shape in a flat plane. One end of the coil 5 is connected to the electrode plate 8, while the other end of the coil 5 constitutes a conducting lead 10A to be electrically connected to the electrode plate 9.

Figure 2:
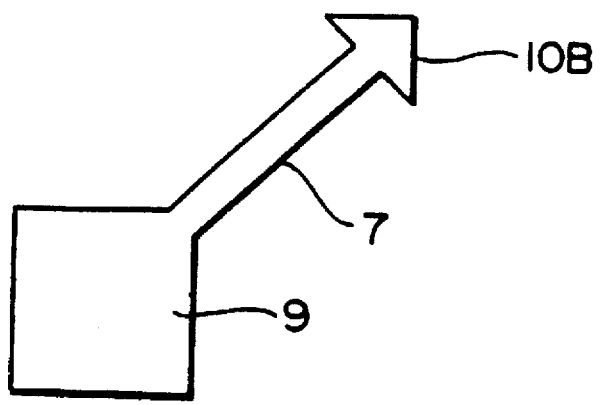
FIG. 2 is a rear view of a component in the resonant circuit shown in FIG. 1.
Figure 3:
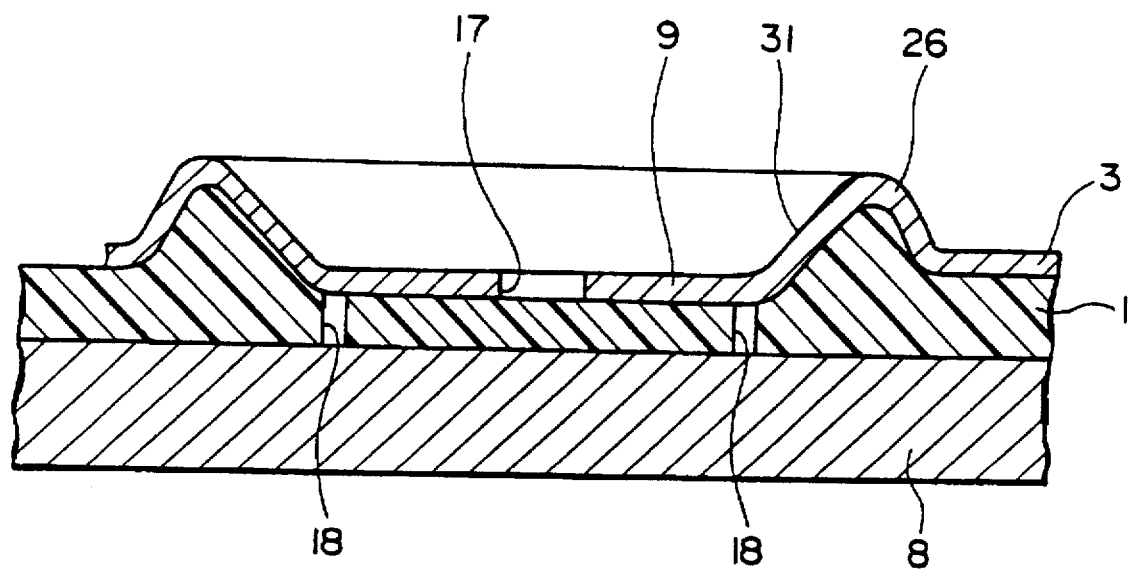
FIG. 3 is an enlarged fragmentary cross section taken on line 3—3 of FIG. 1.
Figure 4:
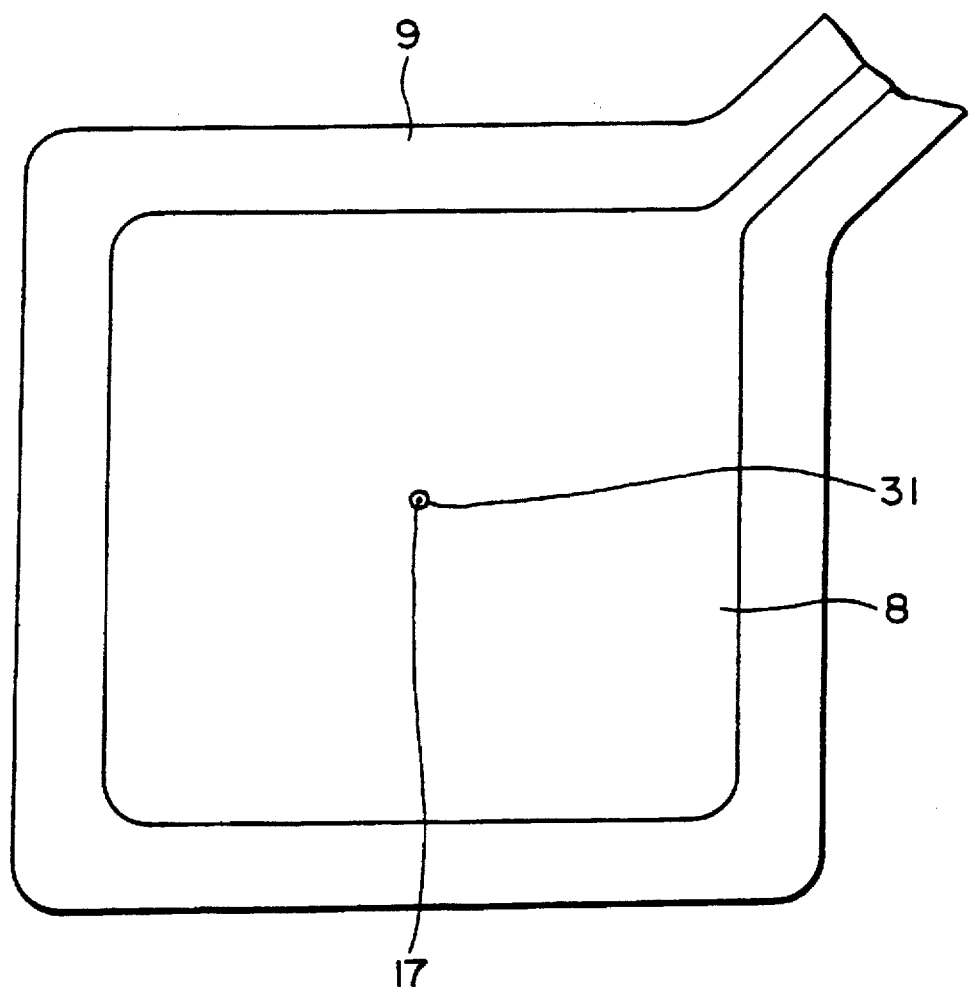
FIG. 4 is an enlarged view of a part of FIG. 2.

The electrode plate 9 is made of a conductive metal foil which has a film thickness thinner than that of the electrode plate 8, and is placed opposite to the electrode plate 8 so that the insulating film 1 lies between these electrode plates 8 and 9. As shown in FIG. 2, the electrode plate 9 is connected to a conductive portion 7 which extends to a conducting lead 10B opposed to the conducting lead 10A formed at the other end of the coil 5. A crater-shaped depressed portion 31 is formed, as shown in FIGS. 3 and 4, in approximately the middle of the electrode plate 9, and a break 17 is formed in the approximate center of the depressed portion 31. At the depressed portion 31, the distance between the electrode plates 8 and 9 is less than at other portions of the electrode plates. The circumference of the depressed portion 31 forms a protrusion 26 which is protuberant compared to the other portions of the electrode plate 9.

On the other hand, the insulating film 1 is made thinner at the position of the depressed portion 31 and the crystal structure of such portion of the insulating film 1 is destroyed. Due to this destruction of the crystal structure, a crevasse shaped penetrating hole 18 is formed, which penetrates through to the electrode plates 8 and 9.

Figure 12:
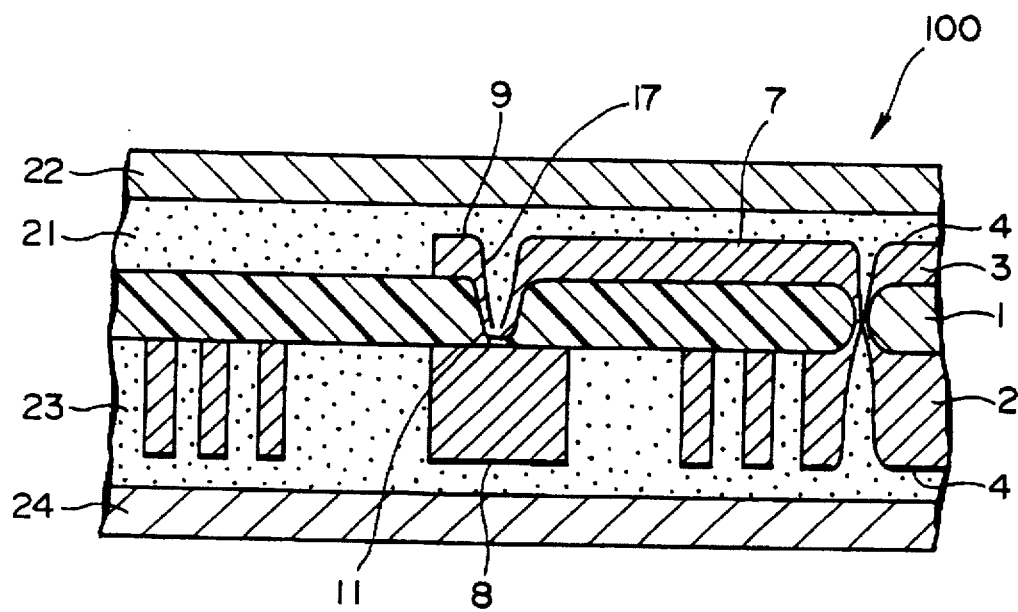
FIG. 12 is a fragmentary cross section depicting the complete structure of the resonant tag of one embodiment of the invention.

On the resonant tag 100, as shown in FIG. 12, a sheet of parting paper 24 is adhered with an adhesive 23 on the side having the electrode plate 8 and the coil 5, and a sheet of wood free paper 22 is adhered with an adhesive 21 on the side of the electrode 9. This structure allows the resonant tag 100 to be adhered at a predetermined position of a product through the adhesive 23 by peeling off the sheet of parting paper 24.

It is preferred that the resonant tag 100 normally has the property to resonate at a detector frequency of approximately 8.2 MHz. In this embodiment of the present invention, the length of a diagonal line across the electrode plate 8 of the capacitor 6 is 18 mm and the length of a diagonal line across the electrode plate 9 is 19 mm.

Figure 5:
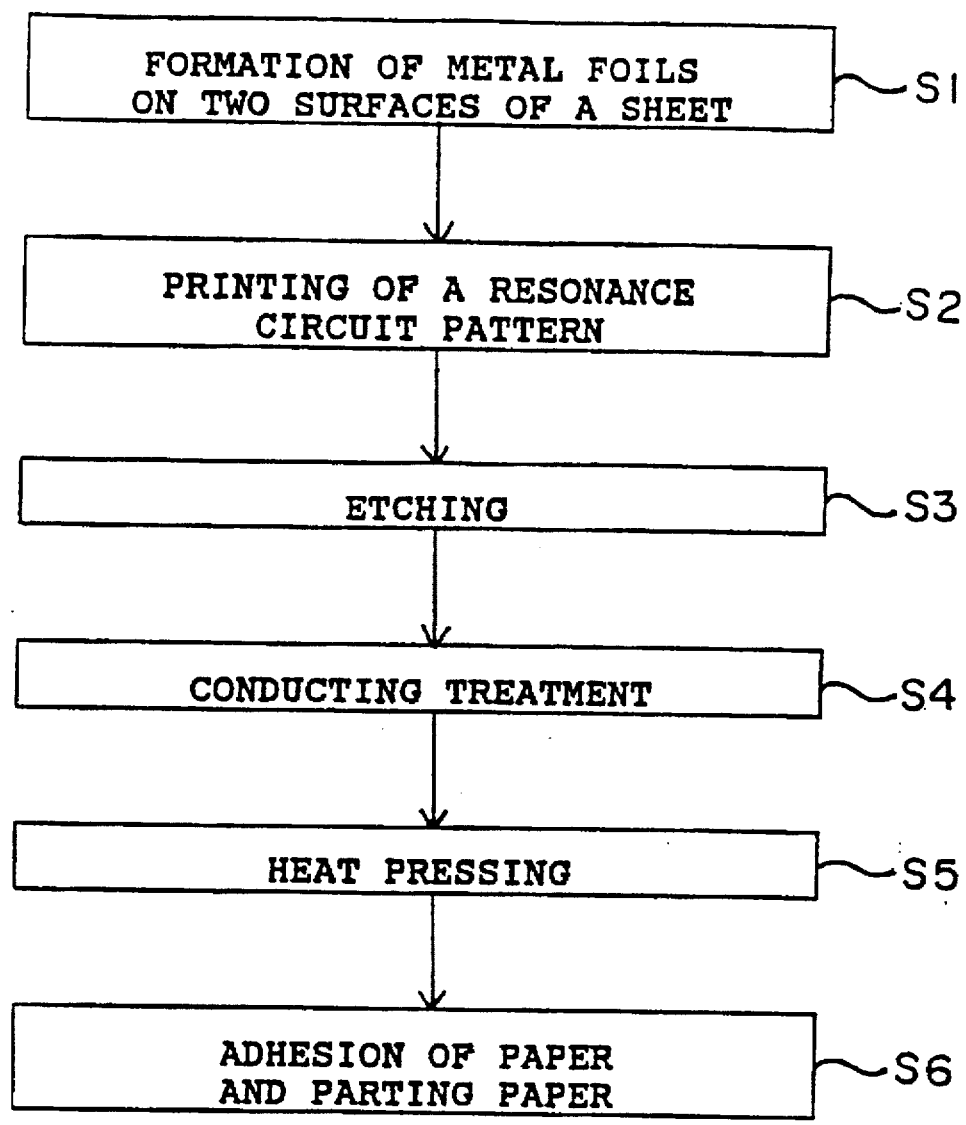
FIG. 5 is a flowchart showing the process of manufacturing the resonant tag of one embodiment of the present invention.

The resonant tag 100 is manufactured using a process shown in FIGS. 5 through 12. The flowchart of the manufacturing process is shown in FIG. 5. The following explanation assumes that a polyethylene resin film is used as the insulating film and an aluminum corresponding to 1235 of AA Standard (standard enacted by the American Aluminum Association) is used for the conductive components of the tag.

Figure 6:
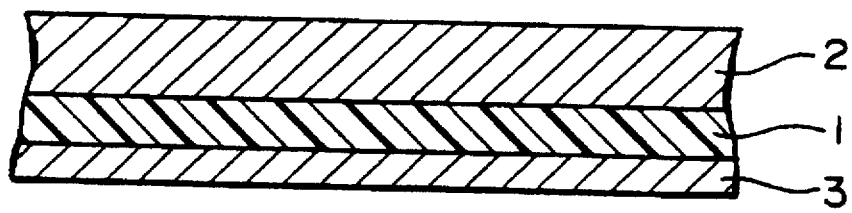
FIG. 6 is a fragmentary cross section depicting a first step in the process of manufacturing the resonant tag of one embodiment of the invention.

In the step shown in FIG. 6, that is, Step (S1) shown in FIG. 5, a conductive metal foil 2 (film thickness: 50 μm) is formed on one surface of the insulating film 1 (film thickness: 26 μm), and a conductive metal foil 3 (film thickness: 12 μm) is formed on the other surface of the insulating film 1. These conductive metal foils 2 and 3 can be formed by a method such as extrusion or heat lamination. In the case of extrusion, the resin of the insulating film 1 is melted, and then the insulating film 1 extruded from a T die of an extruder, and the conductive metal foils 2 and 3 are directly laminated together. In the case of heat lamination, the resin of the insulating film 1 and the conductive metal foils are passed between rollers of a processing machine, which rollers are heated at a predetermined temperature, thereby forming the above-described structure in the heat press and adhesion method which enables adhesion of the insulating film 1 and the conductive metal foils 2 and 3 with the pressure imposed by the rollers.

It is preferred that the resultant flexible sheet of the three-layer structure shown in FIG. 6 has a strength of at least 300 g/cm in consideration of processability thereafter.

For the purpose of obtaining a higher adhesive strength of the insulating film 1 and the conductive metal foils 2 and 3, it is effective to activate the surfaces of both the insulating film 1 and the conductive metal foils 2 and 3 or either of them. For example, a corona discharge treatment can be employed. An adhesive layer may be inserted between the insulating film and the conductive metal foils. In this case, it is desirable to select the same kind of resin adhesive as the resin of the insulating film 1.

Figure 7:
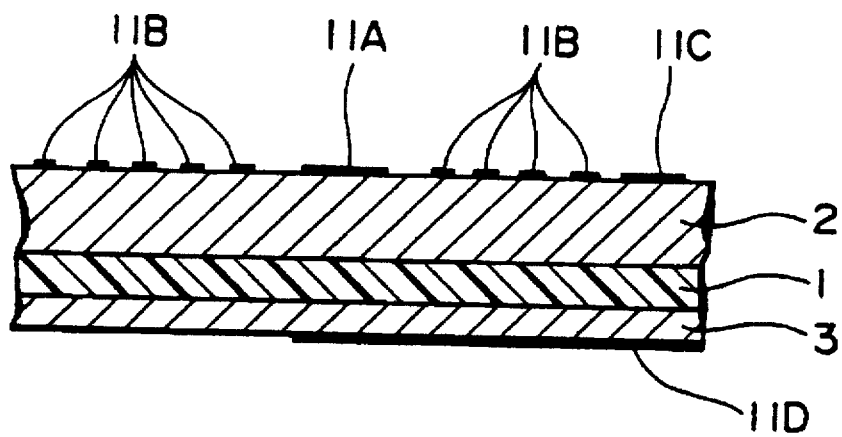
FIG. 7 is a fragmentary cross section depicting a second step in the process of manufacturing the resonant tag of one embodiment of the invention.

In the step shown in FIG. 7, that is, Step (S2) shown in FIG. 5, a pattern 11A for forming the electrode plate of the capacitor, a pattern 11B for forming the coil, and a pattern 11C for forming the conducting lead are printed on the conductive metal foil 2 obtained in the step shown in FIG. 6, by using an etching-proof ink of vinyl acetate chloride or polyester type. A pattern 11D for forming the electrode plate, conductive portion, and conducting lead of the capacitor is printed on the conductive metal foil 3 by using the same ink as used above. Patterns 11A through 11D are printed by a gravure printing method.

Figure 8:
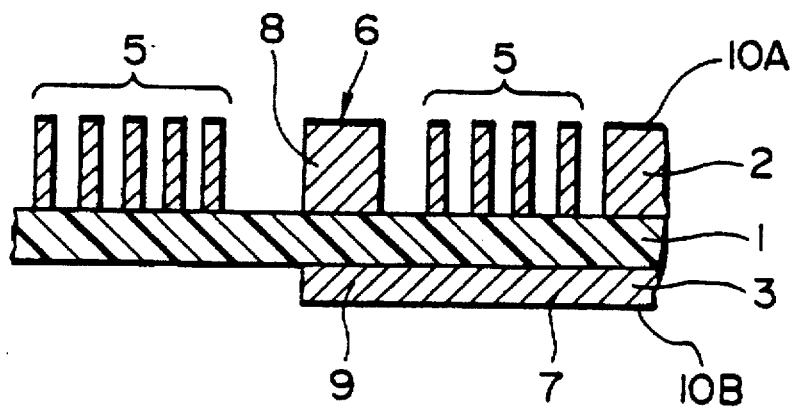
FIG. 8 is a fragmentary cross section depicting a further step in the process of manufacturing the resonant tag of one embodiment of the invention.

In the step shown in FIG. 8, that is, Step (S3) shown in FIG. 5, an etching treatment is conducted on the conductive metal foils 2 and 3 by using patterns 11A through 11D obtained in the step shown in FIG. 7 as a mask, thereby forming the electrode plates 8 and 9, coil 5, conductive portion 7, and conducting leads 10A and 10B. In this etching treatment, for example, an acid etchant, that is, a ferric chloride including various additives, is used.

Figure 9:
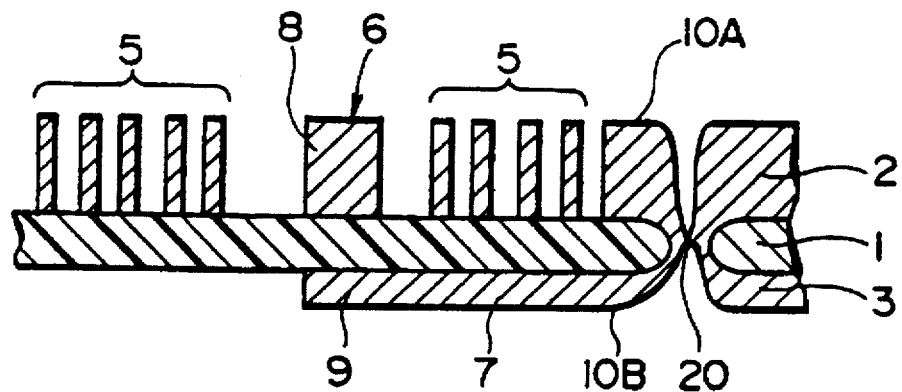
FIG. 9 is a fragmentary cross section depicting another step in the process of manufacturing the resonant tag of one embodiment of the invention.

In the step shown in FIG. 9, that is, Step (S4) shown in FIG. 5, the conducting leads 10A and 10B are connected electrically by providing a short-circuit portion 20. This makes it possible to miniaturize the resonant tag.

Figure 10:
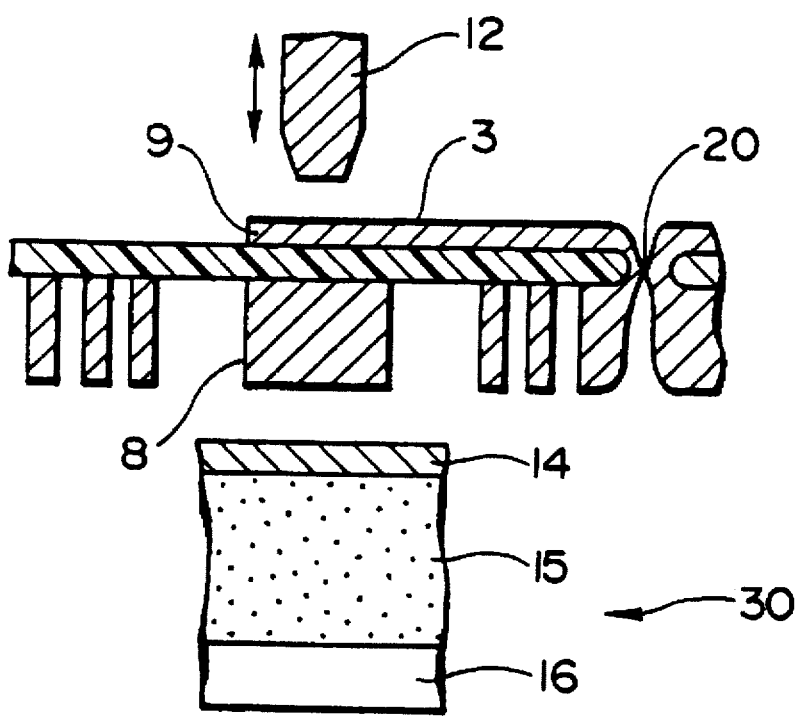
FIG. 10 is a fragmentary cross section depicting an orienting step in the process of manufacturing the resonant tag of one embodiment of the invention.

In the step shown in FIG. 10, that is, Step (S5) shown in FIG. 5, the heat press treatment is applied to the insulating film 1, which exists between the electrode plates 8 and 9, by using a heating jig die 12 and a supporter 30 until the penetrating holes 18 are formed.

The heating jig die 12 to be used for the heat press treatment includes, a die made of steel, having a cylindrical body 3–5 mm in diameter and a conic end shape with an incline of approximately 60 degrees and with a diameter of 0.7 mm at its end face. This heating jig die 12 is designed to generate heat of an optimal temperature by an appropriate means. Moreover, the heating jig die 12 is movable up and down by a vertically moving mechanism (not shown), thereby being capable of pressing a member to be pressed with an optimal pressure.

The supporter 30 is composed of a supporting stand 16, a silicon rubber layer 15 formed on the supporting stand 16 and which is 2–3 mm thick and has 60 degrees of JISA (rubber hardness), and a steel plate 14 which is formed on the silicon rubber layer 15 and which is 0.3 mm thick.

The heat press treatment is performed in the manner described below by using the heating jig die 12 and the supporter 30.

Figure 11:
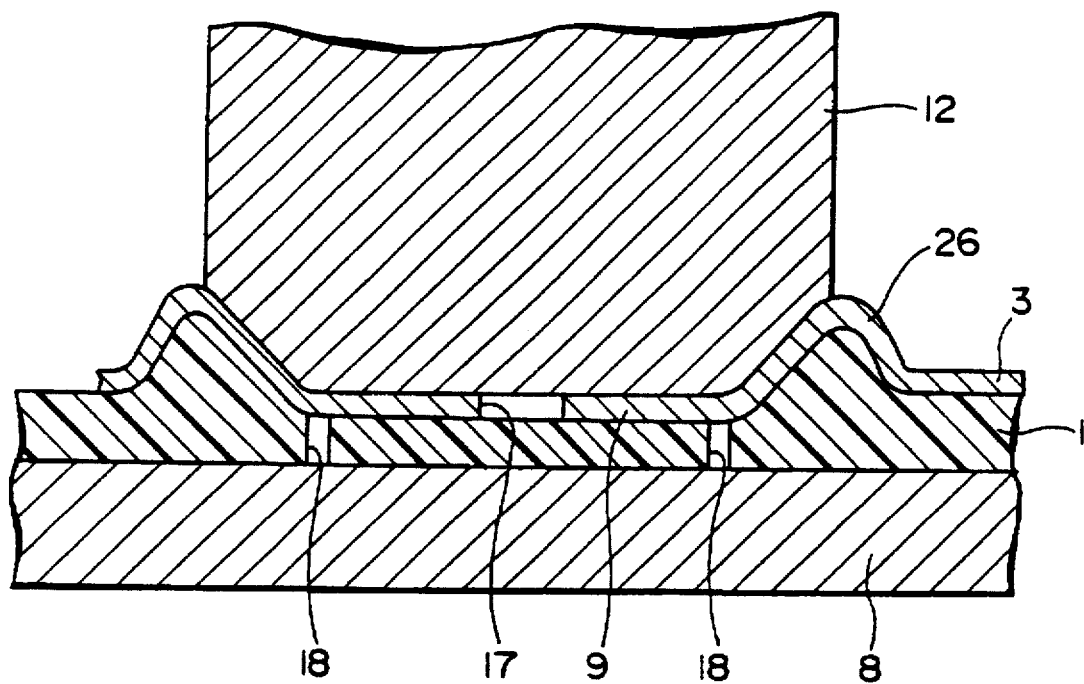
FIG. 11 is a fragmentary cross section depicting a heat pressing step in the process of manufacturing the resonant tag of one embodiment of the invention.

First, the resonant circuit chip obtained in the step shown in FIG. 9 is positioned and mounted on the steel plate 14 of the supporter 30. As shown in FIG. 11, the electrode plate 9 is heated and pressed with a gauge pressure (stroke) of from 9 and 7.5/25 rotations to 9 and 9/25 rotations for 0.3–0.5 seconds by using the heating jig die 12 which is heated at a gauge temperature of 370°–400° C.

Gauge temperature as used herein means a temperature of a holder (not shown) which holds the heating jig die 12.

Gauge pressure, as used herein, means a standard value of pressure obtained by changing the distance (or stroke) between the heating jig die 12 and the supporter 30 by using a gyrograph (product name: INDEX HANDLE, manufactured by MIKI PULLEY). Specifically, by using a device consisting of a seal processing machine on which the heating jig die 12 and the supporter 30 are provided and on which the gyrograph is mounted, the resonant circuit chip is placed at a predetermined position between the supporter 30 and the heating jig die 12, and the gyrograph is then turned to the position where its scale mark indicates the number of rotations in the range from 9 and 7.5/25 rotations to 9 and 9/25 rotations.

By performing the above-described heat pressing treatment, the insulating film 1 existing between the electrode plates 8 and 9 is heated and pressed, thereby destroying a crystal structure of the portion of the insulating film 1 which has a low degree of crystallinity. This results in heat contraction, and as shown in FIGS. 3 through 11, a penetrating hole 18 is formed which is 50–100 μm in diameter and in which a gaseous substance or air exists. Because of the existence of this penetrating hole 18, an arc discharge occurs at this portion between the two electrode plates 8 and 9 of the capacitor 6 with application of a low voltage, and a metallic part of the electrode plates extends along the inner surface of the penetrating hole 18 to short-circuit the electrode plates. Thus, it is possible to carry out the breakdown of the resonance property of the tag with more certainty.

As shown in FIGS. 3 through 11, the above-described heat pressing treatment makes the insulating film of the capacitor 6 thinner (having a film thickness of about 0.2 µm) and deforms the insulating film 1 to correspond to the shape of the heating jig die 12. Furthermore, the pressure and heat applied in the above treatment almost breaks the middle portion of the pressed aluminum foil 3 as shown in FIGS. 3 and 4, thereby forming a break 17 through which the insulating film 1 is exposed. Accordingly, it is possible to prevent the short-circuited electrodes from recovering to the state therebefore. This is because the break 17 releases shocks and vibrational energy which tend to restore the electrode plates, and also releases stress, distortion, etc. generated when the electrode plates tends to recover.

As described above, by performing the heat press treatment until the crystal structure of the insulating film composing the capacitor 6 is destroyed and the penetrating hole 18 is formed, it is possible to prevent the recovery of the resonance property even if heat and shocks are applied to the insulating film or the electrode plates which have been short-circuited by a predetermined method, or if a long period of time has passed after the short-circuit.

The voltage of 4000 V or more is normally required to conduct the dielectric breakdown on the insulating film of the capacitor which comprises a derivative (insulating film) (film thickness: 26 µm). However, there is a problem that the above-mentioned voltage is too high to eliminate the resonance frequency property of the resonant tag. The present invention is capable of making the insulating film of the capacitor to have a thin film thickness of 0.2 µm or less as described above. Also, since the short-circuit of the electrode plates through the penetrating hole 18 is formed, the resonance frequency property of the resonant tag can be eliminated by applying a low voltage of approximately 5–10 V.

In the step shown in FIG. 12, that is, Step (S5) shown in FIG. 5, an acrylic resin adhesive layer 21 is formed on the surface of the conductive metal foil 3 of the resonant circuit chip obtained in the step shown in FIG. 10 and a sheet of wood free paper 22 (55 g/m$^2$) is adhered to the resonant circuit chip through the adhesive layer 21. After a rubber type adhesive layer 23 is formed over the surface of the conductive metal foil 2 of the resonant circuit chip, a sheet of parting paper 24 (60 g/m$^2$) is adhered to the resonant circuit chip through the adhesive layer 23.

The resonant tag 100 in which the resonant circuit including the capacitor 6 is formed is obtained as a result of the above-described steps. This resonant tag 100 can be easily adhered on a desirable product at a desirable position by peeling off the sheet of parting paper 24.

As a result of examination of the degree of recovery of the electrode plates, of the capacitor 6 of the resonant tag 100 and which has been subjected to a short-circuit, by applying heat and vibration to such capacitor, it was confirmed that the electrode plates maintained the state of short-circuit. Moreover, after the electrode plates of the capacitor 6 of the resonant tag 100 was subjected to the short-circuit and was stored for a long period of time, it was confirmed that the electrode plates maintained the state of short-circuit.

As examples of the insulating film 1, synthetic resin such as polypropylene, polystyrene, or polyester may be used, other than a polyester resin film, as long as such synthetic resin has a small dielectric dissipation factor as a physical property, and as long as an accurate tolerance of thickness corresponding to a frequency of the designed circuit can be maintained. The thickness of the insulating film 1 should be within the range of thicknesses sufficiently satisfying the product setting of the resonant tag (size, frequency, performance, etc.), the thickness controlling precision of a machine to be used for forming the film, the strength of materials resistant to machinery processing including the etching and other subsequent processing. However, it is necessary to keep variation of thicknesses of the insulating film 1 within a predetermined range in order to make the capacitor volume of the resonant circuit within a predetermined range of design values. As the condition of this embodiment, it is preferable to make the insulating film 1 in thickness (before the heat press treatment) of about 26±1.5 µm, but there is no limitation to such thickness.

As examples of the conductive metal foils 2 and 3, other than the aluminum corresponding to 1235 of the AA Standard, desirable types of conductive metals such as aluminum corresponding to 1050, 1100, etc. of the AA Standard, desirable kinds of aluminum, gold, silver, copper, and various kinds of alloy can be used.

In the above-described embodiment, the film thickness of the conductive metal foil 2 to be used as an RLC circuit is set at 50 µm in order to lower the value of electric resistance. However, without limitation to the above, the conductive metal foil 2 should only be made in a thickness and size appropriate for the kind of a conductive metal used, the resonant circuit to be formed, or the manufacturing method. The conductive metal foil 3 is made thin in a thickness of 12 µm in order to facilitate the etching processing for the formation of the circuit, and to reduce a processing cost. However, without limitation to the above, the conductive metal foil 3 should only be made in a thickness and size appropriate for the kind of a conductive metal used and the resonant circuit to be formed. Since the conductive metal foil 3 is used only as the electrode plate 9, conductive portion 7, and conducting lead 10B of the capacitor 6, the thin film thickness of 12 µm will not give adverse effect to the performance of the resonant tag.

Considering the cost of materials, it is preferable to use polyethylene resin to compose the insulating film 1 and to use aluminum as a conductive metal to form the RLC circuit. Aluminum is particularly preferable in its material characteristics and especially adhesiveness because it can be easily adhered to the polyethylene resin. Moreover, aluminum is superior in flexibility. As for the polyethylene resin, any type of polyethylene resin having a low, medium, or high density can be used. However, considering the performance as the resonant tag and the material strength in machinery processing, the polyethylene resin having a medium or higher density is preferable.

The pattern for forming the resonant circuit can be formed by various printing methods such as silk screen printing, flexographic printing, or letterpress printing, other than a gravure printing method. Other than the ferric chloride solution with various additives added, the etchant used to form the resonant circuit pattern can be selected as desired, such as acid or alkaline liquid, in accordance with the ink used, etching conditions, and an object to be etched (that is, the conductive metal foil). A temperature and concentration of the etchant, and an etching speed at the time of etching treatment may be decided as desired. As examples of the etching method, dipping, spraying and other various methods can be employed. In the case of a spraying method, it is desirable to precisely control an oil pressure, etc. at the tip of a spray nozzle for the etchant.

In the above-mentioned condition, the temperature of the heating jig die 12 when applying the heat press to the insulating film of the capacitor 6, is set at 370°–400° C. However, there is no limitation to the temperature of the heating jig die 12 as long as it is decided in accordance with the pressure imposed by the heating jig die 12 on the resonant circuit chip, the relation of the heating jig die 12 with the supporter 30, and the kind, film thickness, etc. of the conductive metal foils, and as long as it enables the formation of the penetrating hole in the insulating film without causing any damage to the resonant circuit. For example, if aluminum is used as the conductive metal and if polyethylene is used as the insulating film, a preferable temperature of the heating jig die 12 is approximately 200°–500° C.

Although the gauge pressure of the heating jig die 12 is set at 9 and 7.5/25 rotations to 9/25 rotations in this embodiment, there is no limitation to the gauge pressure of the heating jig die 12 as long as it is decided in accordance with the temperature of the heating jig die 12, the relation of the heating jig die 12 with the supporter 30, and the kind, film thickness, etc. of the conductive metal foils, and as long as it enables the formation of the penetrating hole in the insulating film without causing any hindrance to the resonant circuit. Although a duration of the heat pressing by the heating jig die 12 is set 0.3–0.5 seconds, there is no limitation to the duration of the heat pressing as long as it is decided in accordance with the temperature and pressure of the heating jig die 12, the relation of the heating jig die 12 with the supporter 30, and the kind, film thickness, etc. of the conductive metal foils, and as long as it enables the formation of the penetrating hole in the insulating film without causing any hindrance to the resonant circuit.

The shape of the heating jig die 12 available in the present invention is not limited to the shape introduced in this embodiment, but may be decided in accordance with the size, materials, necessary performance, etc. of the resonant circuit. For example, the shape of the end face of the heating jig die 12 contacting with the electrode plate is not limited to a circular shape, but may be selected from desirable shapes such as a polygon with rounded corners. When the tip of the heating jig die 12 is formed in a conic shape, it is preferable to set an angle of taper with an incline of 30–60 degrees toward its central axis.

The shape of the supporter 30 available for the present invention is not limited to the shape introduced in this embodiment, but may be decided in accordance with the size, materials, necessary performance, etc. of the resonant circuit. For example, it is preferable to set the hardness (JISA) of the supporter 30 at approximately 50–80 degrees. The hardness of the supporter 30 means the hardness of the entire body of the supporter 30 including the steel plate 14 and the silicon rubber 15. If the hardness of the supporter is too high, the structure of the insulating film may be destroyed and, therefore, a stable performance cannot be obtained. On the other hand, if the hardness of the supporter is too low, the penetrating hole cannot be formed in the insulating film. Therefore, the hardness needs to be decided by considering the above facts.

For the supporter 30, an elastic, heat-resistant material such as teflon may be used instead of the silicon rubber. A metal plate such as a stainless steel plate may be used instead of the steel plate. Thicknesses of the silicon rubber and the steel plate may be decided in accordance with the size, composing materials, necessary performance, etc. of the resonant circuit. However, it is particularly preferable to set the thickness of the silicon rubber, for example, at approximately 1–5 mm. Moreover, it is specifically preferable to set the thickness of the steel plate at approximately 0.2–0.5 mm.

Although in this embodiment of the present invention, only one resonant tag is illustrated in the drawings for the purpose of simplifying the explanation, Steps (S1) through (S6) shown in FIG. 5 may be conducted simultaneously on a plurality of the resonant tags of this invention in a roll form (for example, a roll of width 700–900 m×length 1200 m or of width 200–300 m×length 600 m). In this case, at Step (S6) shown in FIG. 5, a multiple-layer structural body to which the sheet of wood free paper and the sheet of parting paper are adhered is cut by a platen press machine or a rotary press machine into dimensions of 40 mm×40 mm in accordance with the size of a product. Then the unnecessary portion of the multiple-layer structural body is wound and removed except for the parting paper. Thereafter, a roll of sheet-shaped resonant tags with the parting paper facing outward is produced.

This embodiment describes the resonant tag 100 made by pasting the wood free paper and the parting paper on the resonant circuit chip. However, without limitation to the above, plastic films or other materials may be laminated on the resonant circuit chip as long as such materials can retain the resonant circuit chip in a good condition and can be adhered to a product easily and securely. Not only the pasting method, but also other methods may be employed. Moreover, the resonant tag of the present invention may be used without Step (S6) shown in FIG. 5.

Figure 13:
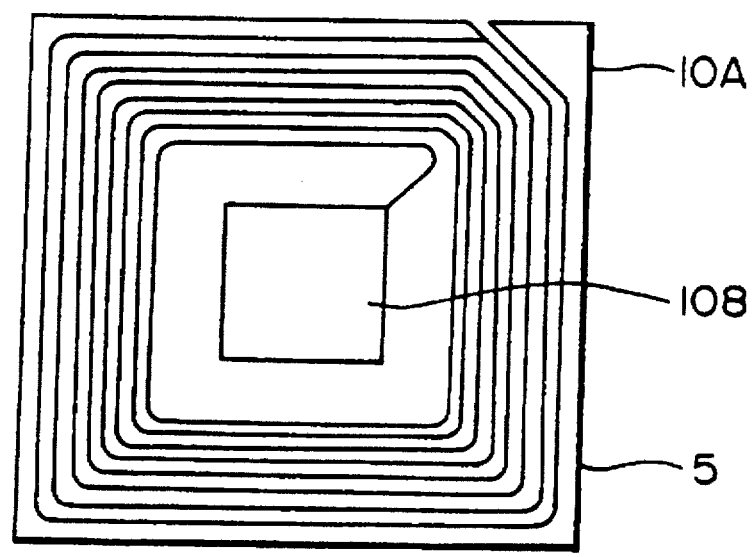
FIG. 13 is a plan view of the resonant circuit of another embodiment of the invention.
Figure 14:
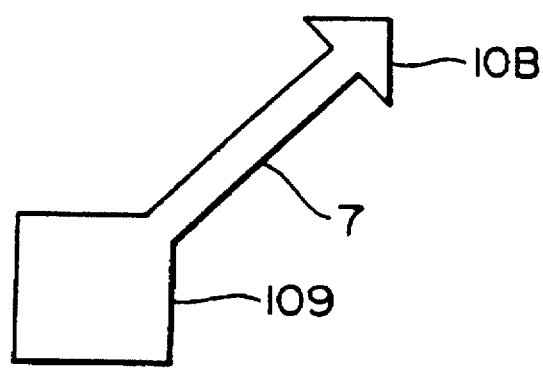
FIG. 14 is a partial rear view of the resonant circuit shown in FIG. 13.

Another embodiment of the present invention is hereinafter explained with reference to the drawings. FIG. 13 is an enlarged cross-sectional view of a capacitor of the resonant tag according to another embodiment of the present invention. In this second embodiment, however, any detailed explanation is omitted about the same structure and the portions obtained from the same manufacturing process as those of the resonant tag 100 according to the aforementioned first embodiment.

The resonant tag of this second embodiment is different from the resonant tag 100 obtained in the first embodiment, as shown in FIGS. 13 through 16, in that no break is formed in the conductive metal foil 3, and that an area of the thin film portion of the insulating film 1 is larger.

This resonant tag is manufactured in the manner described below. Namely, the resonant tag of the second embodiment employs the same manufacturing process as that of the aforementioned resonant tag 100 until Step (S4) (conducting treatment) shown in FIG. 5.

Figure 15:
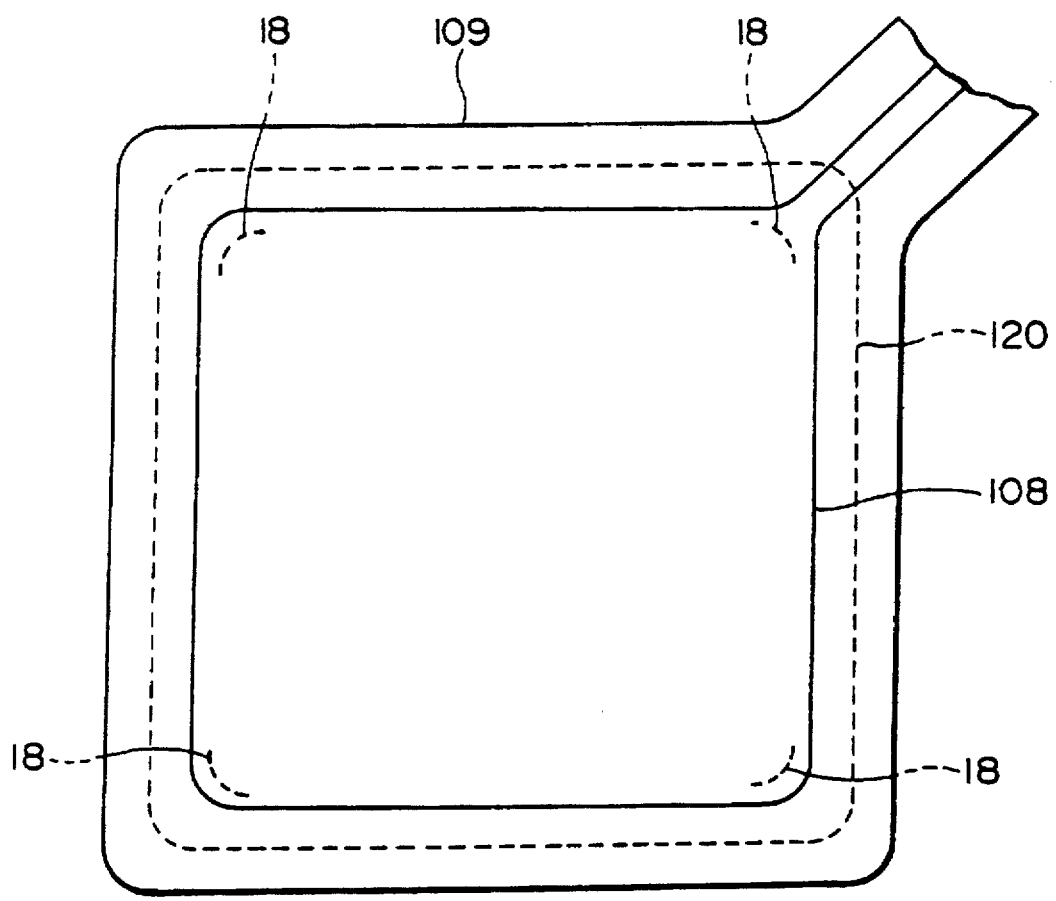
FIG. 15 is a partially enlarged view of FIG. 13.
Figure 17:
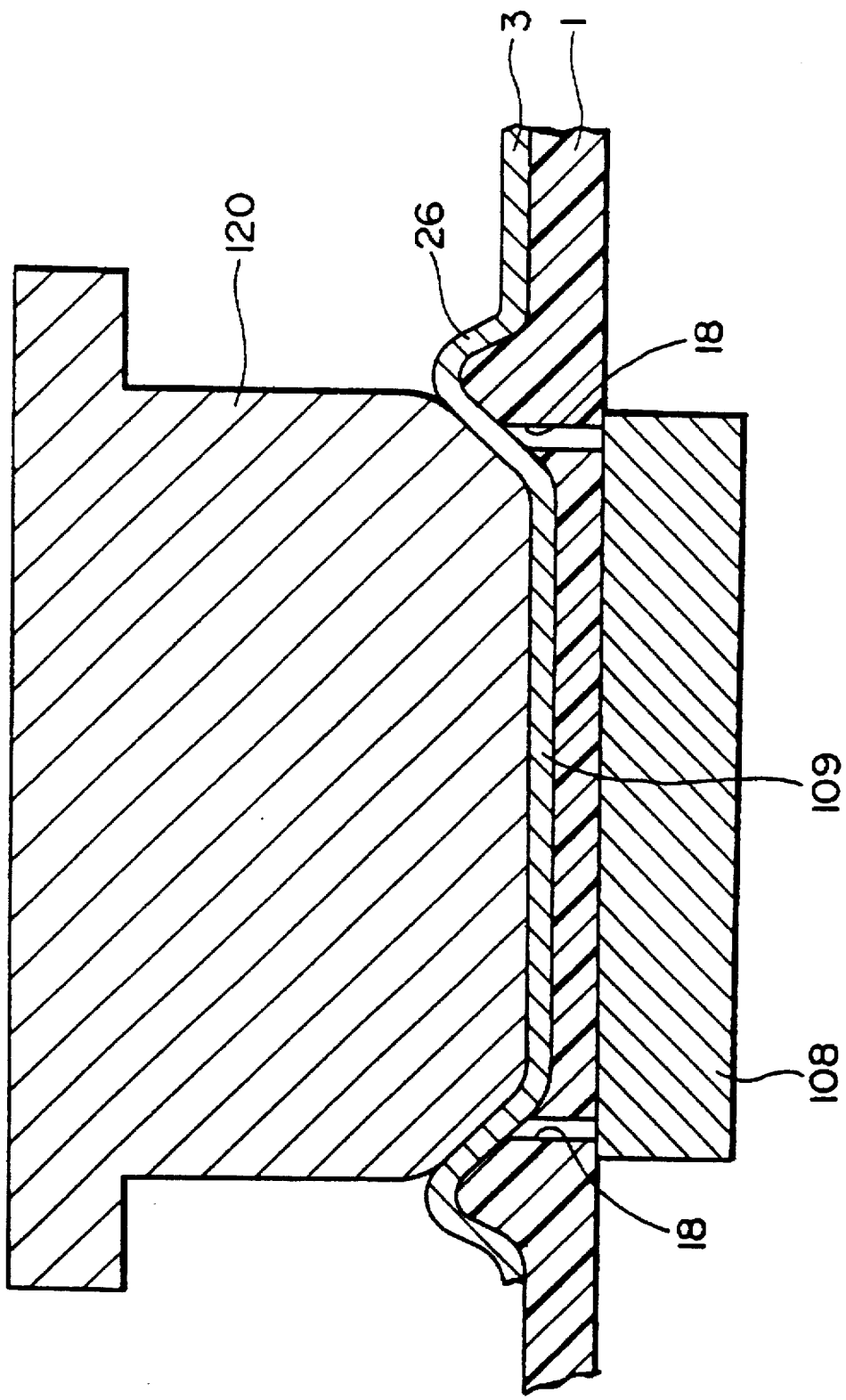
FIG. 17 is a fragmentary cross section depicting a step in the process of manufacturing the resonant tag of another embodiment of the invention.

In Step (S5) (heat press treatment) shown in FIG. 5, that is, the step shown in FIG. 17, the heat press is applied to the insulating film 1 existing between electrode plates 108 and 109 of a capacitor 106 by using a heating jig die 120 and a supporter 30 until penetrating holes 18 are formed. Necessary conditions of the heat press treatment are as follows:

The jig die 120 used for the above-described heat press treatment is a die made of steel which comprises a taper with an incline of 45 degrees at the tip of its substantially square-shaped body, which is 12 mm in diagonal, and of which end face is formed in a substantial square shape with rounded corners, as shown in a dashed line in FIG. 15. This heating die 120 contains a heating element (not shown in the drawings) which is capable of controlling the generation of heat at an optimal temperature. Moreover, the heating jig die 120 is movable up and down by a vertically moving mechanism (not shown in the drawings) and is capable of pressing an object to be pressed with an optimal pressure.

If the heating jig die 120 contacts the insulating film 1, which is thermoplastic, at the time of heat pressing, the insulating film 1 becomes sticky and attaches to the press surface, thereby causing a problem of decrease in thermal efficiency. Accordingly, in this embodiment, as shown in FIG. 15, the end face of the heat jig die 120 which contacts with the electrode plate 109 is made in a smaller size than the size of the electrode plate 109, and the electrode plate 108 is made a size smaller than the electrode plate 109 in order to avoid contact with the insulating film 1. Specifically, a diagonal of the electrode plate 108 is made 9 mm long, and a diagonal of the electrode plate 109 is made 16 mm long. This makes it possible to utilize the portion of the electrode plate 109 extending beyond the heating jig die 120 as a contact-preventing cover, thereby solving the above-described problem. Since the heating jig die 120 is tapered around its periphery, when it is separated from the electrode plate 109 after the heat press, it is possible to avoid any trouble such as the heating jig die 120 getting caught by a protrusion 26. However, the same jig die 30 as that used in the aforementioned first embodiment may be used in the second embodiment.

Figure 16:
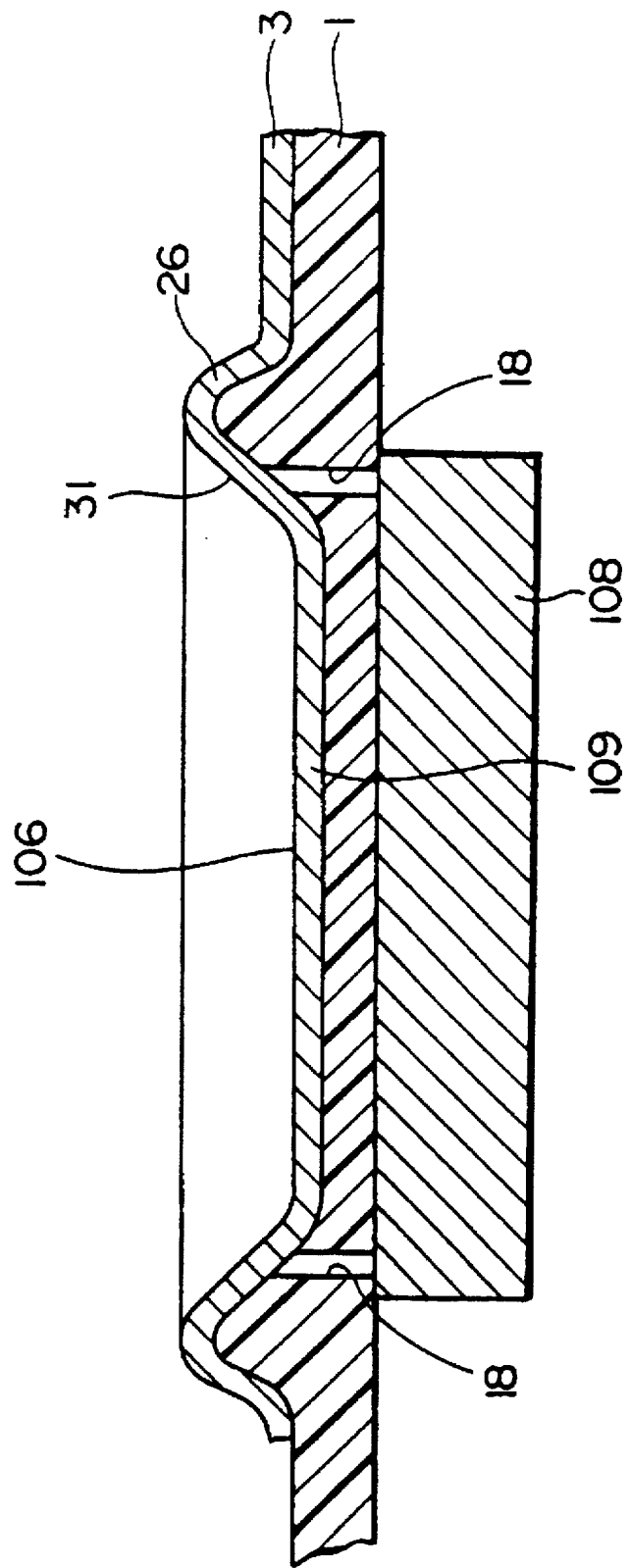
FIG. 16 is a fragmentary cross section of the resonant circuit of another embodiment of the invention.

The process of heat press on the insulating film 1 is basically the same as that shown in FIGS. 10 and 11, except that the gauge temperature of the heating jig die 120 is set at 370°–400° C., that the gauge pressure (stroke) is set at 9 and 7.5/25 rotations to 9 and 9/25 rotations, and that the heat press is performed for 0.3–0.5 seconds. By this heat pressing, the insulating film 1 existing between the electrode plates 108 and 109 is heated and pressed through the electrode plate 109. At this time, crystal structures of the portions having a low degree of crystallinity of the insulating film 1 which exists between the electrode plates 108 and 109 are destroyed, and heat contraction occurs at such portions, thereby producing crevasses. These crevasses grow into penetrating holes 18 which penetrate through both the electrode plates 108 and 109 and in which a gaseous substance or air exists. As shown in FIGS. 15 and 16, these penetrating holes 18 are formed at the positions corresponding to the four corners of the capacitor 106. The insulating film composing the capacitor 106 is made in a thin film thickness of 18 μm in average, and the shape of the insulating film 1 changes in accordance with the shape of the tip of the heating jig die 120.

Since the size relation of the electrode plates 108 and 109 and the heating jig die 120 is as described above, even if the heat press is applied, the coil 5, conductive portion 7, and conducting leads 10A and 10B do not deform, but can maintain their optimal shapes.

Subsequently, the resonant tag in which the resonant circuit including the capacitor 106 is formed is obtained by the same process as that described for the resonant tag 100.

The degree of recovery of the electrode plates, which composes the capacitor 106 and which has suffered a short-circuit, was examined by using the resonant tag obtained above and by applying heat and vibrations to such electrode plates. As a result, it was confirmed that the electrode plates maintained the state of short-circuit. Moreover, after the capacitor of the resonant tag obtained above was made to suffer the short-circuit and was stored for a long period of time, it was confirmed that the electrode plates maintained the state of short-circuit.

Figure 18:
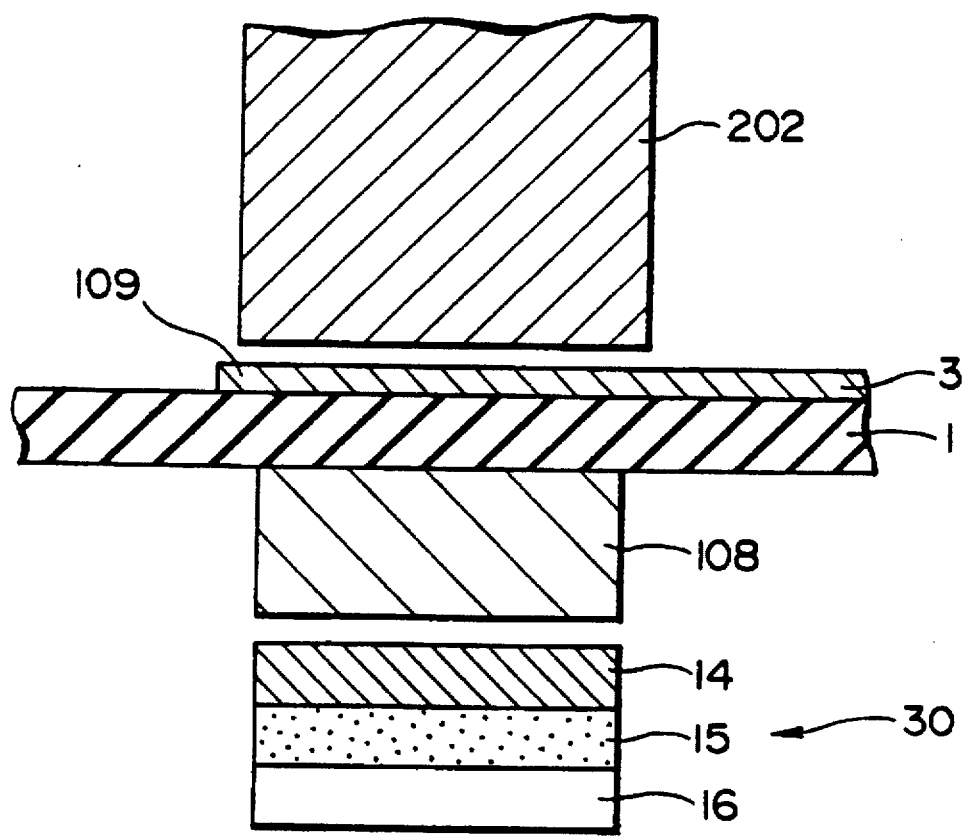
FIG. 18 is a fragmentary cross section depicting another step in the process of manufacturing the resonant tag of another embodiment of the invention.

Other than the heat jig die 120 of the shape shown in FIG. 17, a heating jig die 202 shown in FIG. 18, which is not tapered at its end contacting with the electrode plate 9, may be used for the above-described heat press. It is desirable that the resonant tag obtained by using the heating jig die 202 also has the property to resonate normally at a detecting frequency of 8.2 MHz just like the aforementioned resonant tag. The relation of thickness with size (length×width) of the insulating film of the capacitor in this case is shown in Table 1.

| Size | length mm × width mm | Thickness μm |
| --- | --- | --- |
| | 13 × 14 | 26 |
| | 10 × 10 | 14 |
| | 7.5 × 7.5 | 8 |

Also in this case, it is preferable to set the gauge temperature of the heating jig die 202 at 370°–400° C. and the gauge pressure (stroke) is set at 9 and 7.5/25 rotations to 9 and 9/25 rotations, and to perform the heat press for 0.3–0.5 seconds.

Table 2 shows the relation of a temperature of the heating jig die 102 with a duration of heat press (with a pressure of 4 Kg/cm$^2$) for the purpose of forming the penetrating holes 18 in the insulating film of the capacitor 106 of the resonant tag in the shape shown in FIGS. 13 through 16. Table 3 shows the relation of a pressure with a duration of heat press (at a temperature of 250° C.).

[TABLE 2)

| Temperature (°C.) | Duration (seconds) |
| --- | --- |
| 200 | 3.5 |
| 250 | 3 |
| 300 | 1.5 |

[TABLE 3)

| Pressure (Kg/cm2) | Duration (seconds) |
| --- | --- |
| 3 | 4.5 |
| 4 | 3 |
| 5 | 2 |

The above explanation is given concerning the case when the penetrating holes 18 are formed at the portions of the insulating film 1 corresponding to the four corners of the capacitor 106. However, without limitation to the above, the formation mode of the penetrating holes 18 can be optionally decided according to the property, size, manufacturing method, etc. of the resonant tag. Moreover, the pattern of the capacitor 106 and the coil 5 may be changed as desired.

As described above, the present invention makes it possible to make the insulating film composing the capacitor to have a thin film thickness, to destroy the crystal structure of such thin film portion, and to form the penetrating hole which penetrates from the one electrode plate through the other electrode plate of the capacitor. Accordingly, in addition to the formation of a thinner portion of the insulating film, it is possible to cause an arc discharge at the penetrating hole when destroying the resonance property. As a result, the short-circuit can be performed between the two electrode plates with certainty even with application of a low voltage. It is also possible to prevent the recovery of the resonance property of the resonant tag, even if heat or shocks are applied to the tag, or, if a long period of time has passed after the resonance property breakdown. Accordingly, it is possible to provide the highly reliable resonant tag which can be prevented from repeatedly resonating with a wave generated by a detector after the resonant tag has lost its resonance frequency property. Moreover, since the insulating film in which the penetrating hole is formed obtains stability, the resonant tag can be stored in the state before occurrence of the resonance property breakdown for a long period of time without hindering its performance. As a result, the reliability of the resonant tag can be enhanced with certainty.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

We claim:

1. A resonant tag in which a resonant circuit including a capacitor is formed,
   one electrode plate of said capacitor and an electric circuit formed on one surface of an insulating film, said electric circuit being electrically connected to said capacitor, and
   another electrode plate of said capacitor formed on the other surface of said insulating film, said another electrode being electrically connected to said electric circuit,
   wherein said insulating film lying between the two electrode plates has a portion with a thinner film thickness than that of its remaining portion, and a crystal structure of said thin insulating film portion is destroyed to form a penetrating hole extending through the insulating film to both the electrode plates.

2. A resonant tag according to claim 1, wherein a protrusion is formed circumferentially around said portion of the insulating film with a thin film thickness.

3. A resonant tag according to claim 1 or 2, wherein a break, through which said insulating film is exposed, is formed in either one of the electrode plates of said capacitor.

4. A method of manufacturing a resonant tag in which a resonant circuit including a capacitor is formed, comprising the steps of:
   forming one electrode plate of said capacitor and an electric circuit on one surface of an insulating film, said electric circuit being electrically connected to said capacitor;
   forming another electrode plate of said capacitor at a position opposite said one electrode plate on the other surface of said insulating film, said another electrode plate being electrically connected to said electric circuit; and
   performing heat pressing by applying a predetermined pressure to the insulating film lying between the two electrode plates at a predetermined temperature to shorten a distance between the electrode plates, and then to destroy a crystal structure of said insulating film to form a penetrating hole extending through the insulating film to both the electrode plates.

5. A method of manufacturing a resonant tag according to claim 4, wherein said heat pressing is conducted until a break is formed on either one of said electrode plates, through which break said insulating film is exposed.

6. A method of manufacturing a resonant tag according to claim 4 or 5, wherein said another electrode plate is thinner in film thickness than that of said one electrode plate, and said heat pressing step is conducted by supporting the side of said one electrode plate with a supporter and by pressing said another electrode plate with heat by using a jig die.

7. A method of manufacturing a resonant tag according to claim 6, wherein said supporter includes a two-layer structure consisting of a layer of elastic, heat-resistant material and a metal layer, and supports said one electrode plate with said metal layer contacting with said one electrode plate.

8. A method of manufacturing a resonant tag according to claim 6, further including the step of heating said jig die and wherein one end of said jig die, which contacts with said other electrode plate, is tapered around its periphery toward its central axis, and wherein the end face of said tapered end contacts said another electrode plate to conduct heat pressing.

9. An apparatus for performing heat press on an insulating film, comprising:
   a supporter for supporting one side of said insulating film, said supporter comprising a two-layer structure including a layer of elastic, heat-resistant material; and
   a jig for pressing the other side of said insulating film with heat, and including heating means and a jig die, one end of said jig die, which contacts with an electrode plate the other side of the insulating film, is tapered around its periphery toward its central axis.

* * * * *